United States Patent

Jacquet et al.

[11] Patent Number: 6,148,015
[45] Date of Patent: Nov. 14, 2000

[54] DEVICE, IN PARTICULAR A SEMICONDUCTOR DEVICE, FOR PROCESSING TWO WAVES, IN PARTICULAR LIGHT WAVES

[75] Inventors: Joël Jacquet, Limours; Salim Gurib, Arpajon; Francis Doukhan, Cessoy En Montois; Hugues Le Quellec, Saint-Tropez, all of France

[73] Assignee: Alcatel, Paris, France

[21] Appl. No.: 08/987,382

[22] Filed: Dec. 9, 1997

[30] Foreign Application Priority Data

Dec. 9, 1996 [FR] France .................................. 96 15083

[51] Int. Cl.[7] .............................. H01S 3/19; H01L 29/06
[52] U.S. Cl. ................................ 372/50; 372/43; 372/45; 372/48; 257/21; 257/22; 257/98; 257/184
[58] Field of Search ................................ 372/43, 48, 50, 372/44, 45; 257/17, 21, 22, 84, 85, 98, 184

[56] References Cited

U.S. PATENT DOCUMENTS

| | | | |
|---|---|---|---|
| 4,292,512 | 9/1981 | Miller et al. | 250/205 |
| 5,140,149 | 8/1992 | Sakata et al. | 372/50 X |
| 5,144,637 | 9/1992 | Koch et al. | 372/50 |
| 5,283,799 | 2/1994 | Jacquet et al. | 372/50 |
| 5,400,419 | 3/1995 | Heinen | 385/14 |
| 5,745,512 | 4/1998 | Miller | 372/20 |
| 5,808,314 | 9/1998 | Nakajima et al. | 257/17 |

FOREIGN PATENT DOCUMENTS

0732782A1  9/1989  European Pat. Off. ............. 385/50 X

OTHER PUBLICATIONS

U. Koren et al, "Strained–Layer Multiple Quantum Well Distributed Bragg Reflector Lasers witha Fast Monitoring Photodiode", *Applied Physics Letters*, vol. 58, No. 12, Mar. 25, 1991, pp. 1239–1240.

*Primary Examiner*—Brian Healy
*Attorney, Agent, or Firm*—Sughrue, Mion, Zinn, Macpeak & Seas, PLLC

[57] ABSTRACT

A common InP semiconductor substrate device includes a laser emitter H1 for emitting waves having a first wavelength such as 1,300 nm, a photodiode H2 for receiving and detecting waves having a second wavelength such as 1,550 nm, and a separator G absorbing the waves having the first wavelength, the separator being interposed between the laser emitter H1 and the photodiode G for protecting the photodiode against the waves having the first wavelength. An absorption measurement mechanism Q delivers a signal iG representative of the power of the waves absorbed by the separator G, to make it possible to regulate operation of the laser emitter H1. The semiconductor substrate device is particularly applicable to implementing end devices to be installed on subscriber premises for subscribers to optical fiber interactive local area networks.

9 Claims, 2 Drawing Sheets

DEVICE, IN PARTICULAR A SEMICONDUCTOR DEVICE, FOR PROCESSING TWO WAVES, IN PARTICULAR LIGHT WAVES

BACKGROUND OF THE INVENTION

The present invention generally relates to processing to be performed on two waves having different wavelengths. The processing considered is, for example, emitting or modulating such a wave, or receiving such a wave for the purpose of retrieving a signal that was carried by said wave. The waves to be processed may, in particular, be of the radio, acoustic, or optical types.

The invention is applicable when the two waves in question are to be processed respectively in two distinct members, and when one of the members is to be protected against the waves of the other member in that, if the member to be protected receives the waves processed or to be processed by the other member, operation of the member to be protected is disturbed. When, in addition, the two members are to be situated close together in a medium enabling the two waves in question to propagate, implementing suitable protection for the member to be protected then constitutes a first problem.

OBJECTS AND SUMMARY OF THE INVENTION

To solve the first problem, the present invention provides, in known manner, a device including:

- a first processing member which operates such that desired processing is performed on waves having a first wavelength;
- a second processing member which operates such that desired processing is performed on waves having a second wavelength, operation of said second processing member requiring protection to be provided for said second member against waves having the first wavelength; and
- a separator absorbing the waves having the first wavelength, which separator is interposed between the first processing member and the second processing member in order to provide said second member with said protection.

A second problem can also be posed by the fact that certain operating parameters of the processing members are subject to variations, and that it can then be useful to collect information on such variations, e.g. to implement regulation so as to limit the variations. Additional members are then provided to collect and optionally to use such information. They generate manufacturing and/or operating costs, and they can be problematically voluminous.

An object of the present invention is also to solve the second problem in a manner that is simple, cheap, and compact. For this purpose, the device of the invention further includes absorption measurement means delivering an absorption measurement signal representative of the power of the waves absorbed by said separator so as to constitute information on operation of said first processing member. Advantageously, said absorption measurement means may regulate operation of the first processing member, in particular when the processing performed by said operation is emission of waves having the first wavelength.

Although the invention is described above in general manner, it is more particularly and advantageously applicable when the waves in question are of the optical type, and travel along optical fibers. It is known that the considerable development of "multimedia" services is facilitating the development of optical fiber interactive networks, in particular local area networks. That type of network requires end devices to be used and installed on subscriber premises, and such devices must be high-performance, robust, and very cheap to enable the services in question to be mass-distributed. More precisely, as regards their performance, such devices must be capable of receiving optical signals at data rates of up to 622 Mbit/s with very low sensitivity to polarization, and they must be capable of emitting signals at data-rates of more than 155 Mbit/s. An advantageous configuration in the networks in question consists in using simultaneous both-way transmission. The end devices must then be of the transceiver type, i.e. each such device must perform the functions of emission at a first wavelength, and of reception at a second wavelength. It must also include an additional member enabling the up channels and the down channels (and thus the wavelengths) to be separated, thereby making it possible for information to be interchanged in both directions and simultaneously.

Furthermore, the device must be capable of operating under difficult conditions, i.e. over a temperature range from −40° C. to +85° C. (without using a Peltier-effect regulator). To ensure that the emitter member included in the device operates well, regulation must then be performed by servo-controlling the current powering the member on the optical power emitted by it. The power must therefore firstly be measured. The present invention provides a simple way of measuring the power.

BRIEF DESCRIPTION OF THE DRAWINGS

Two embodiments of devices of the invention are described below by way of example and with reference to the accompanying diagrammatic figures. When two elements play identical or analogous parts in both of the embodiments they are designated by the same references in the figures, optionally supplemented by the numeral 1 or 2.

In the figures.

MORE DETAILED DESCRIPTION

Figure 1:
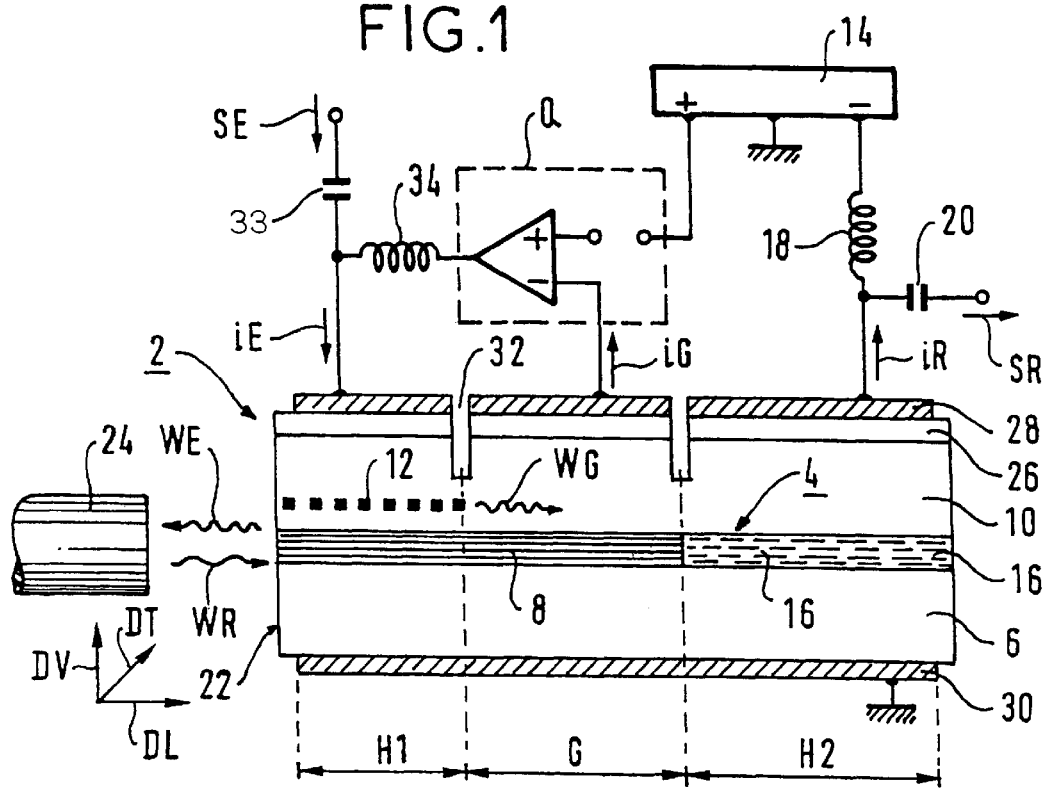
FIG. 1 shows a first embodiment of the invention.

The first embodiment given by way of example comprises a semiconductor chip 2 made up of layers succeeding one another in crystal continuity from bottom to top in a vertical direction DV defined relative to said chip. The chip includes a waveguide 4 extending in a horizontal longitudinal direction DL also defined relative to said chip, for guiding two light waves respectively having said first wavelength and said second wavelength. The second wavelength is longer than the first wavelength. Both the chip and the waveguide successively include the following going forward along the longitudinal direction DL:

- a first processing segment H1 belonging to said first processing member;
- a separation segment G belonging to said separator; and
- a second processing segment H2 belonging to said second processing member.

To avoid cluttering the figures, said segments are designated by the same references as the members of which they constitute the respective parts included in the chip 2.

The separation segment of the chip 2 includes an absorbent structure made up of said layers. The absorbant structure constitutes the essential portion of this segment. That is why it is designated in the figures by the same references as said segment. The same applies for other semiconductor structures making up the essential portions of other segments of the chip 2. The absorbant structure includes the following in succession in the vertical direction DV:

a bottom doped layer 6 of a first conductivity type (n);

a non-doped layer 8, i.e., more precisely, a layer exempt from intentional doping; and a top doped layer 10 of the second conductivity type (p).

The non-doped layer is made of a material having a characteristic wavelength greater than or equal to the first wavelength, and less than the second wavelength. It includes the separation segment of the waveguide.

The absorption measurement signal delivered by the absorption measurement means Q is constituted by the magnitude of a measurement current iG flowing between the bottom doped layer 6 and the top doped layer 10 of the absorbant structure G. These means are powered by a voltage source 14. They preferably maintain a small reverse bias of the absorbant structure.

The first processing member H1 is typically constituted by a laser emitter. It emits two light waves having the first wavelength and having respective power values controlled by a common power supply current iE of the laser emitter. The two waves respectively constitute an output wave WE propagating backwards along said longitudinal direction DL, and a regulation wave WG propagating forwards along said longitudinal direction in the waveguide 4 so as to be absorbed in the separator G. The absorption measurement means Q then constitute a regulating member at least partially controlling the power supply current as a function of the absorption measurement signal iG so as to regulate the power of the output wave.

The length of the separation segment of the waveguide is then typically longer than the wavelength of the waveguide of a regulating diode of known type whose function is to regulate a semiconductor laser emitter. The separation segment must further perform the function of protecting the second processing member. The wavelength is typically 100 $\mu$m when the chip is based on indium phosphide and operates at wavelengths in the vicinity of 1.3 $\mu$m and 1.5 $\mu$m. The electrical bias in the separation segment, e.g. $-3$ v is typically different from the bias known for this protection function because it must be matched to an appropriate measurement of the power of the absorbed waves.

Figure 2:
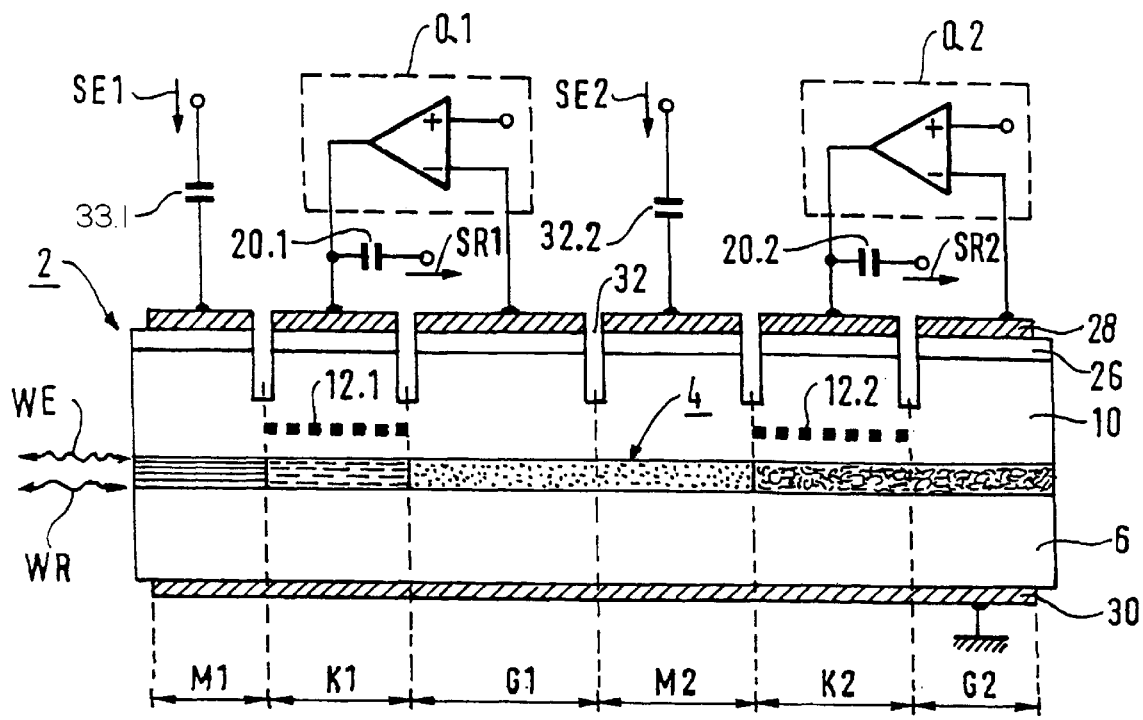
FIG. 2 shows a second embodiment of the invention.

The power supply current of the laser may carry a signal to be emitted which is to be carried by the wave having the first wavelength, as in the first embodiment shown in FIG. 1. It is also possible for it not to carry the signal which is then applied to an electro-optical modulator modulating the light emitted by the laser emitter, such a modulator being integrated in said chip in the second embodiment shown in FIG. 2.

To constitute a laser emitter, as indicated above, the chip 2 typically includes, in its first processing segment, an emitter structure H1 made up of said layers, and including in succession said bottom doped layer 6, a non-doped layer 8, and said top doped layer 10. The non-doped layer is made of a material having a characteristic wavelength equal to the first wavelength. It includes the first processing segment of the waveguide 4. In this segment, the chip 2 further includes reflector means 12 for including the first processing segment of the waveguide in a longitudinal optical cavity. The reflector means are constituted conventionally by a Bragg grating so as to constitute a DFB-type laser. The device further includes power supply means for forwardly biasing the emitter structure so as to deliver the power supply current for the laser emitter. The power supply means include the current source 14 powering the laser H1 via the regulating member Q.

In the first embodiment given by way of example, the non-doped layers of the emitter structure and of the absorbant structure constitute a common layer 8 made of a material whose characteristic wavelength is equal to said first wavelength. In the second embodiment given by way of example, the characteristic wavelength of the material of the non-doped layer of the absorbent structure is longer than the first wavelength.

Typically, in its second processing segment, the chip 2 includes a second processing structure made up of said layers and including the following in succession in the vertical direction DV:

said bottom doped layer 6;

a non-doped layer 16; and said top doped layer 10.

This non-doped layer has a characteristic wavelength not less than the second wavelength. The device further includes means for electrically biasing the second processing structure. These means include the voltage source 14 which powers the structure via a separation inductor 18.

The means for electrically biasing the second processing structure typically reverse bias the structure so that it constitutes a receiver structure H2. The bias voltage applied to the structure typically lies in the range $-2$ V to $-5$ V. The device further includes means for delivering a receive signal SR representative of the variations in a current iR flowing between the bottom doped layer 6 and the top doped layer 10 of the structure in response to an input wave WR having the second wavelength. The structure H2 thus constitutes a receiver photodiode which is integrated in the chip 2 with the laser emitter H1. For example, the receive signal may be delivered via a separation capacitor 20.

Preferably, said input wave WR propagates forward along the longitudinal direction DL so that the input wave WE and the output wave WR pass through the same connection face 22 of the chip. This face makes it possible to connect the device optically to an optical fiber 24 guiding and conveying the two waves for connecting the device and the subscriber on whose premises it is installed to the other members of an interactive network.

More particularly, in the semiconductor component of the first device given by way of example and shown in FIG. 1, the layers of the semiconductor chip 2 are made of indium phosphide InP unless otherwise indicated. This chip is provided with electrodes on its two main faces. The component then includes at least six homogeneous or composite layers as follows from bottom to top:

A first layer is a bottom metal electrode 30.

A second layer is a thin substrate constituting the above-mentioned bottom doped layer 6. This substrate is 0.1 mm thick and it is n-doped at a concentration lying in the range $1 \times 10^{18}$ cm$^{-3}$ to $3 \times 10^{18}$ cm$^{-3}$.

A third layer is composite in that it comprises two partial non-doped layers forming two successive longitudinal fractions of the above-mentioned waveguide 4. The width of the waveguide, e.g. 2 $\mu$m, is much smaller than the width of the chip 2, e.g. 100 $\mu$m, the widths being measured in a transverse direction perpendicular to the above-mentioned longitudinal direction and horizontal direction.

In the first processing segment H1 and in the separation segment G, the waveguide 4 is constituted by a non-doped layer 8 whose characteristic wavelength is about 1,300 nm. This layer may be made of a quaternary alloy of gallium and indium arsenide and phosphide GaInAsP. Its thickness is typically 100 nm. It may also be constituted by multiple quantum wells, offering better operating stability in the presence of large variations in temperature. In order to confine the optical mode better in the non-doped layer, said layer may be disposed between two layers of materials having intermediate characteristic wavelengths between the characteristic wavelength of the non-doped layer, and the characteristic wavelength of the bottom and top doped layers, and having typical thicknesses lying in the range 10 nm to 100 nm.

In the second processing segment H2, the non-doped layer 16 is implemented in a manner such that it absorbs all light having a wavelength lying in the range 1,510 nm to 1,590 nm.

For this purpose, it is made of a GaInAsP quaternary alloy which offers the advantage of enabling reception to be independent of the polarization of the input wave WR. It can also be constituted by multiple quantum wells with mechanical stresses being formed in the wells and the barriers to provide insensitivity to the polarization of the input wave. The thickness of this layer typically lies in the range 100 nm to 1,000 nm depending on the desired reception passband and efficiency.

The fourth layer is a top doped layer 10. It is p-doped at $1 \times 10^{18}$ cm$^{-3}$, and its thickness lies in the range 1,000 nm to 4,000 nm.

In the vicinity of the waveguide 4 in the first processing segment H1, a Bragg grating is formed constituting the above-mentioned reflector means 12. This grating is implemented by periodically etching a GaInAsP quaternary alloy layer buried in the material of the layer 10 by resuming epitaxy. The etched layer is p-doped at the same concentration as the layer 10, and its thickness typically lies in the range 40 nm to 100 nm. It is separated from the layer 8 by a thickness lying in the range 50 nm to 300 nm so as to make it possible to obtain sufficient optical coupling with the layer 8, which thickness is taken up by the material of the layer 10. It is possible to extend the grating into the separation segment G.

The fifth layer is a contact layer 26 made of a GaInAsP quaternary alloy p-doped at $3 \times 10^{19}$ cm$^{-3}$, e.g. to enable ohmic contact to be obtained with a metal. This layer is 300 nm thick.

The sixth layer is a top metal electrode 28. This electrode is separated into three segments longitudinally coinciding with the segments H1, G, and H2 of the chip, and designated by the same references. This separation is achieved by isolation channels such as 32 etched through the electrode and through the contact layer 26 and penetrating into the top doped layer 10. Proton implanting in the layer 10 at the bottoms of the channels can be performed to improve the electrical isolation between the successive segments.

A high-frequency input signal SE to be transmitted is received via a separation capacitor 33. It modulates the power supply current iE of the laser emitter constituted by the segment H1. This modulation is thus applied to the output wave WE. A separation inductor 34 prevents the measurement means Q from receiving the signal. In practice, the measurement means Q provide the functions of separating between high frequency and low frequency, which functions are represented symbolically in FIG. 1 by the capacitor 33 and the inductor 34.

The three segments H1, G, and H2 of the chip 2 can be integrated on a common substrate 6 by various known technologies.

Using the "butt coupling" technology, the steps are, in particular, as follows: the materials of the segment H2 are grown over the entire length of the substrate up to the non-doped layer. These materials are etched in the segments H1 and G. The materials necessary for making these two segments are grown up to the layer which is to serve to form the Bragg grating 12. This layer is etched to form the grating 12. The materials of the top doped layer and of the contact layer are grown. Finally, the top electrode is deposited, and the isolation channels such as 32 are etched.

Using another technology referred to as "evanescent coupling", the materials of the segments H1 and G are grown over the entire length of the substrate, as is a non-doped layer made of the material of the layer 16 whose presence is ultimately to be necessary in the segment H2 only. Then this non-doped layer is removed in the segments H1 and G. The final chip thus differs from the above-described chip in that the segment H2 includes two superposed non-doped layers.

Finally, using another known technology referred to as "Selective Area Growth (SAG)", the non-doped layers of the three segments are constituted by multiple quantum wells, and they are formed in a single epitaxial growth step. For this purpose, windows are formed through oxide masks and the difference to be obtained between the characteristic waves of the layers 8 and 16 is obtained by giving different values to the widths of these windows.

The width of the waveguide 4 may be delimited in a single etching step over its entire length. In the above-described example, it is of the known "Buried Ridge Structure (BRS)" type. It may also be of the "ridge" type, in which case confining the optical mode in the transverse direction is not achieved by limiting the width of the non-doped layers, but rather by limiting the width of a strip etched for this purpose in an overlying layer of a material having a relatively high refractive index.

The second embodiment of the invention (see FIG. 2) is generally analogous to the first embodiment, but it differs therefrom in the manner indicated below.

It includes a succession of six segments M1, K1, G1, M2, K2, and G2. The segments K1 and K2 are respectively analogous to the segments H1 and H2 of the first device except for two differences: firstly, each of them can perform emission and/or reception functions. Secondly, in performing their emission function, they do not act as modulators, modulation being performed by the respective modulation segments M1 and M2. The segment G1 both protects the segments M2, K2, and G2 against waves having the first wavelength, and also regulates the laser emitter constituted by the segment K1 provided with a Bragg grating 12.1. The only function of the segment G2 is to regulate the laser constituted by the segment K2 by means of a Bragg grating 12.2.

The modulation segments M1 and M2 are biased by means (not shown) under a reverse voltage of about −3 V. The characteristic wavelengths of the materials of the non-doped layers longitudinally succeeding one another and constituting the waveguide 4 are approximately as follows:

1,280 nm in segment M1;
1,300 nm in segment K1;
1,500 nm in segments G1 and M2; and
1,550 nm in segments K2 and G2.

The input signals SE1 and SE2 are received via capacitors 32.1 and 33.2 in the segments M1 and M2, and the output signals SR1 and SR2 are delivered via capacitors 20.1 and 20.2 respectively from the segments K1 and K2.

Integrating the six segments is advantageously achieved using SAG technology, at least when it is acceptable for reception to be sensitive to the polarization of the input wave(s).

Figure 3:
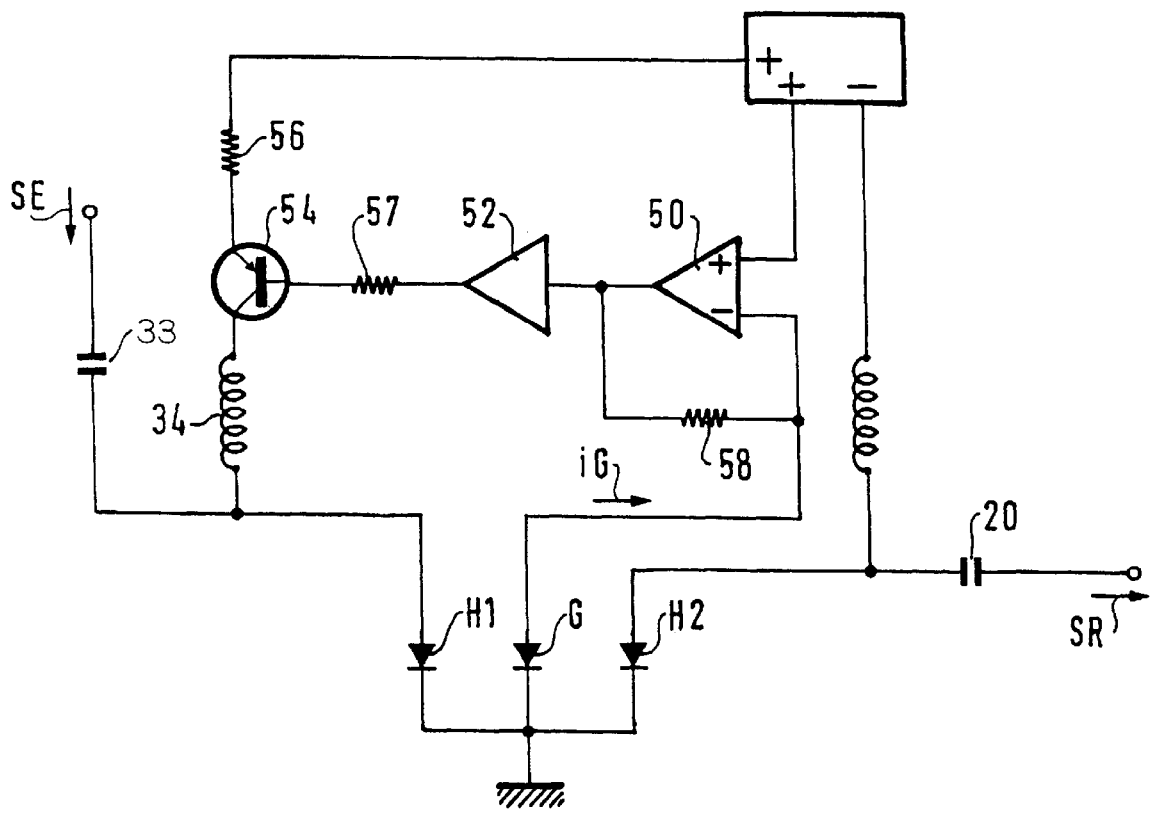
FIG. 3 shows an electronic circuit for regulating the power supply current of the laser emitter of the device shown in FIG. 1.

FIG. 3 shows an electronic servo-control circuit by way of example. This circuit regulates the emitter member of the first device given by way of example and simultaneously constitutes the above-mentioned measurement means Q. The members constituted by the segments H1, G, and H2 are shown in the form of diodes. The circuit Q includes a comparator 50 whose inverting input receives the measurement signal iG delivered by the diode G. This comparator is followed by an inverter 52 for controlling the base of a pnp transistor 54 which controls the power supply current of the laser diode constituted by the segment H1. Link resistors are shown at 56, 57, and 58.

We claim:

1. A device, in particular a semiconductor device, for processing two waves, in particular light waves, said device including:
    a first processing member which operates such that desired processing is performed on waves having a first wavelength;
    a second processing member which operates such that desired processing is performed on waves having a second wavelength, operation of said second processing member requiring protection to be provided for said second member against waves having the first wavelength; and
    a separator absorbing the waves having the first wavelength, which separator is interposed between the first processing member and the second processing member in order to provide said second member with said protection;
    said device further including absorption measurement means delivering an absorption measurement signal representative of the power of the waves absorbed by said separator so as to include information on operation of said first processing member.

2. A device according to claim 1, wherein said absorption measurement means regulates operation of said first processing member, said processing performed by said operation being emission of waves having said first wavelength.

3. A device according to claim 1, said device further comprising a semiconductor chip made up of layers succeeding one another in crystal continuity from bottom to top in a vertical direction of the chip, said chip including a waveguide extending in a horizontal longitudinal direction of the chip for guiding two light waves respectively having said first wavelength and said second wavelength, the second wavelength being longer than the first wavelength, both said chip and said guide including the following in succession going forward along said longitudinal direction:
    a first processing segment belonging to said first processing member;
    a separation segment belonging to said separator; and
    a second processing segment belonging to said second processing member, said separation segment of the chip including an absorbant structure made up of said layers, said structure including the following in succession in said vertical direction:
    a bottom doped layer of a first conductivity type;
    a non-doped layer; and
    a top doped layer of the second conductivity type;
    the non-doped layer being made of a material having a characteristic wavelength greater than or equal to said first wavelength and less than said second wavelength, the non-doped layer including said separation segment of said waveguide; and
    said absorption measurement signal delivered by the absorption measurement means including a magnitude of a measurement current flowing between said bottom doped layer and said top doped layer of the absorbant structure.

4. A device according to claim 3, wherein said first processing member is a laser emitter emitting two light waves having said first wavelength and having respective power values controlled by the same power supply current of the laser emitter, the two waves respectively including an output wave propagating backwards along said longitudinal direction, and a regulation wave propagating forwards along said longitudinal direction in said waveguide so as to be absorbed in said separator, said absorption measurement means including a regulating member at least partially controlling the power supply current as a function of said absorption measurement signal so as to regulate said power of the output wave.

5. A device according to claim 4, wherein said chip further comprises, in its first processing segment, an emitter structure including said layers, and successively including said bottom doped layer, a non-doped layer, and said top doped layer, the non-doped layer being made of a material having a characteristic wavelength equal to said first wavelength, the non-doped layer including said first processing segment of the waveguide, the chip further including, in this segment, reflector means for including said first processing segment of the waveguide in a longitudinal optical cavity,
    said device further comprising power supply means, for forwardly biasing said emitter structure so as to deliver said power supply current for powering the laser emitter.

6. A device according to claim 4, wherein said chip further comprises, in its second processing segment, a second processing structure made up of said layers and including the following in succession in the vertical direction:
    said bottom doped layer;
    a non-doped layer; and
    said top doped layer;
    said non-doped layer having a characteristic wavelength not less than said second wavelength, said device further including means for electrically biasing said second processing structure.

7. A device according to claim 6, wherein said means for electrically biasing said second processing structure reversely biases the structure so that it includes a receiver structure, said device further comprising means for delivering a receive signal representative of the variations in a current iR flowing between said bottom doped layer and said top doped layer of said structure in response to an input wave having said second wavelength.

8. A device according to claim 7, wherein said input wave propagates forward along said longitudinal direction so that the input wave and the output wave pass through a same connection face of the chip.

9. A device according to claim 3, wherein said chip is based on gallium arsenide, and said first and second wavelengths lying respectively in vicinities of 1,300 nm and of 1,550 nm.

* * * * *